United States Patent
Suh

(10) Patent No.: US 8,085,583 B2
(45) Date of Patent: Dec. 27, 2011

(54) VERTICAL STRING PHASE CHANGE RANDOM ACCESS MEMORY DEVICE

(75) Inventor: Dong-seok Suh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 250 days.

(21) Appl. No.: 12/458,099

(22) Filed: Jun. 30, 2009

(65) Prior Publication Data

US 2010/0020593 A1 Jan. 28, 2010

(30) Foreign Application Priority Data

Jul. 24, 2008 (KR) .................. 10-2008-0072439

(51) Int. Cl.
*G11C 11/00* (2006.01)
(52) U.S. Cl. .................... 365/163; 438/102; 257/369
(58) Field of Classification Search .................. 365/163, 365/148, 189.01; 257/2, 4, 369; 438/102, 438/104, 95
See application file for complete search history.

(56) References Cited

U.S. PATENT DOCUMENTS

| 6,577,535 B2 * | 6/2003 | Pasternak ................. 365/185.11 |
| 7,704,788 B2 * | 4/2010 | Youn et al. ................. 438/102 |
| 2007/0045692 A1 * | 3/2007 | Kim et al. .................. 257/295 |

FOREIGN PATENT DOCUMENTS

| JP | 2003-303941 | 10/2003 |
| KR | 10-2006-0032215 | 4/2006 |
| KR | 10-2008-0022184 | 3/2008 |

* cited by examiner

Primary Examiner — Dang Nguyen
(74) Attorney, Agent, or Firm — Harness, Dickey & Pierce, PLC

(57) ABSTRACT

A phase change random access memory device is disclosed including a first electrode, a second electrode, a phase change material layer between the first and second electrode, a plurality of gate layers formed along the phase change material layer, an insulating film between the phase change material layer and the plurality of gate layers, and a plurality of interlayer insulating layers between the plurality of gate layers and between the first and second electrode and the plurality of gate layers, in which multiple bits of information may be stored in a single memory cell corresponding to the positions of the plurality of gate layers.

19 Claims, 9 Drawing Sheets

VERTICAL STRING PHASE CHANGE RANDOM ACCESS MEMORY DEVICE

PRIORITY STATEMENT

This application claims priority under 35 U.S.C. §119 to Korean Patent Application No. 10-2008-0072439, filed on Jul. 24, 2008, in the Korean Intellectual Property Office (KIPO), the entire contents of which are incorporated herein by reference.

BACKGROUND

1. Field

Example embodiments relate to a semiconductor memory device, and more particularly, to a vertical string phase change random access memory device.

2. Description of the Related Art

Non-volatile memory devices include phase change random access memory (PRAM), ferroelectric random access memory (FeRAM), and magnetic random access memory (MRAM). A phase change random access memory device uses a phase change material in a data storage layer that, for example, changes electrical resistance depending on whether the phase change material is in an amorphous or crystalline phase. Examples of conventional phase change materials include those based on Ge—Sb—Te, which exhibit a higher resistance in the amorphous phase than in the crystalline phase.

The phase transformation between an amorphous phase and a crystalline phase is caused by current generated Joule heating. For example, when a voltage is applied to a phase change material for a relatively short period of time, a portion of the phase change material is heated above a temperature in which the material remains crystalline (e.g., above its crystallization temperature) and the material transforms into an amorphous phase. The material will retain the amorphous phase if it is rapidly cooled. To transform a material from an amorphous phase to a crystalline phase, a voltage is applied to the phase change material for a relatively long period of time in which the material re-crystallizes to a crystalline phase.

In the conventional art, phase change memory devices have a single set and reset state. The phase transformation from an amorphous phase to a crystalline phase is defined as a 'set' operation and the voltage applied to the phase change material during the set operation is referred to as a 'set voltage'. The phase transformation from a crystalline phase to an amorphous phase is defined as a 'reset' operation, and the voltage applied to the phase change material during the reset operation is referred to as a 'reset voltage'. Accordingly, conventional phase change memory devices may only store one binary-bit of information.

SUMMARY

Example embodiments disclose a vertical string phase change random access memory device that may simultaneously store more than two bits of information in a single phase change material layer. Another method to increase integration density is to simultaneously store more than two bits of information in a single memory cell. In order to store more than two bits, a single phase change material layer may be formed to have a plurality of resistance values and a single memory cell may be formed of a plurality of phase change material layers.

According to example embodiments, a phase change random access memory device may include a lower electrode, an upper electrode, a phase change material layer between the lower electrode and the upper electrode, an insulating film on the phase change material layer, a plurality of gate layers between the lower electrode and the upper electrode, and a plurality of interlayer insulating layers between the plurality of gate layers and between the lower and upper electrodes and the plurality of gate layers, wherein the insulating film is between the plurality of gate layers and the phase change material layer.

The phase change material layer may have a cylindrical bar shape, configured to extend between the lower and upper electrodes, and electrically contact the lower electrode and the upper electrode. The gate layers may have a thin film plane shape, be parallel to each other and correspond to different positions on the phase change material layer. The different positions on the phase change material layer may correspond to a plurality of regions, in which each gate layer may apply an electric field to the region that corresponds to the gate layer.

According to example embodiments, a phase change random access memory device is disclosed in which the entire phase change material layer may be in a crystalline phase at an initial state. The phase change memory device may be configured to initialize the phase change material layer in an initialization operation. The initialization operation includes maintaining the temperature of the phase change material layer beyond a crystallization temperature by applying a voltage only to the phase change material layer without applying a voltage to the gate layers.

The phase change random access memory device may include a plurality of regions in the phase change material layer corresponding to the plurality of gate layers and each gate layer applies an electric field to the region corresponding to the gate layer. The phase change random access memory device may be configured so that one or more of the plurality of regions is in an amorphous phase after one or more writing operations occur. The writing operations may include applying a positive gate voltage to one of the plurality of gate layers and applying a RESET pulse to the phase change material layer through the upper and lower electrode. A negative gate voltage may be applied to gate layers that correspond to regions of the phase change material layer in which data is already recorded (i.e., the regions that are already in an amorphous state).

The phase change random access memory device may be configured so that one or more of the plurality of regions is in a crystalline phase after one or more erase operations. An erase operation may include applying a SET pulse to the phase change material layer through the upper electrode and the lower electrode when a positive gate voltage is applied to the gate layer that corresponds to the region of the phase change material layer from which data is to be erased and a negative gate voltage is applied to the remainder of the gate layers.

The phase change random access memory device may be configured for a read operation so that high or low resistance states may be individually identified in determining whether data is stored. The read operation may include determining whether all the plurality of regions are in a low resistance crystalline state by applying a read voltage to the phase change material layer through the lower electrode and the upper electrode without applying a voltage to the gate layers, and if a high resistance state is determined, additionally applying a negative voltage to all of the plurality of gate layers sequentially removing and reapplying the gate voltage to the plurality of gate layers while the read voltage is continuously applied to the phase change material layer.

According to example embodiments, the phase change random access memory device may include a phase change material layer that is in a high resistance state when crystalline and a low resistance state when amorphous.

According to example embodiments, a method of operating a phase memory device is disclosed. The method may include providing a plurality of gate layers along various positions of the phase change material layer of which a side surface is surrounded by an insulating film, initializing the phase change material layer to a crystalline phase by annealing the phase change material layer, applying a positive gate voltage to one of the gate layers, and performing a writing operation on a region of the phase change material layer that corresponds to the gate layer to which the positive gate voltage has been applied, by applying a RESET pulse to the phase change material layer when the positive gate voltage is maintained.

The method may further include applying a negative gate voltage to one of the gate layers that corresponds to a region of the phase change material layer where data is already recorded, applying a positive voltage to another one of the gate layers that corresponds to a region of the phase change material layer where data is to be recorded, and performing an additional writing operation by applying a RESET pulse to the phase change material layer while the positive and negative gate voltages are maintained.

The method may further include initializing the entire phase change material layer by maintaining the temperature of the phase change material layer beyond a crystallization temperature, by applying a voltage only to the phase change material layer without applying a voltage to the gate layers.

The method may further include applying a positive gate voltage to a gate layer that corresponds to a region of the phase change material layer from which data is to be erased, applying a negative gate voltage to the rest of the gate layers, and performing an erasing operation with respect to a specific region of the phase change material layer, by applying a SET pulse to the phase change material layer while the positive and negative gate voltages are maintained.

The method may further include applying a read voltage to the phase change material layer when a voltage is not applied to the gate layers, reading an entire data of "0" if the phase change material layer is in a low resistance state when the resistance of the phase change material layer is compared to a reference resistance, applying a negative gate voltage to the all of the gate layers in a state that the read voltage is continuously applied to the phase change material layer if the phase change material layer is in a high resistance state, determining the resistance of the phase change material layer while sequentially removing the negative gate voltages from the gate layers one by one, and performing a read operation in which data stored in the region of the phase change material layer that corresponds to the gate layer is read as "1" if the phase change material layer becomes a high resistance state when the negative gate voltage is removed from one of the gate layers.

BRIEF DESCRIPTION OF THE DRAWINGS

Example embodiments will be more clearly understood from the following brief description taken in conjunction with the accompanying drawings.

FIG. 1 is a schematic cross-sectional view of the structure of a single memory cell of a vertical string phase change random access memory device, according to an example embodiment;

FIG. 2 is a perspective view of a phase change material layer and gate layers of the memory cell of FIG. 1;

FIG. 3 is a schematic cross-sectional view of the structure of a memory cell array of a vertical string phase change random access memory device, according to an example embodiment;

FIGS. 4 and 6 are schematic drawings for explaining a writing operation of a vertical string phase change random access memory device, according to an example embodiment;

FIGS. 5 and 7 show states of applying a pulse voltage in a writing operation of the vertical string phase change random access memory device, according to an example embodiment;

FIGS. 8-9 show states of applying a pulse voltage in an erasing operation of the vertical string phase change random access memory device, according to an example embodiment; and FIG. 10 shows states of applying a pulse voltage in a reading operation of the vertical string phase change random access memory device, according to an example embodiment.

Figure 1:
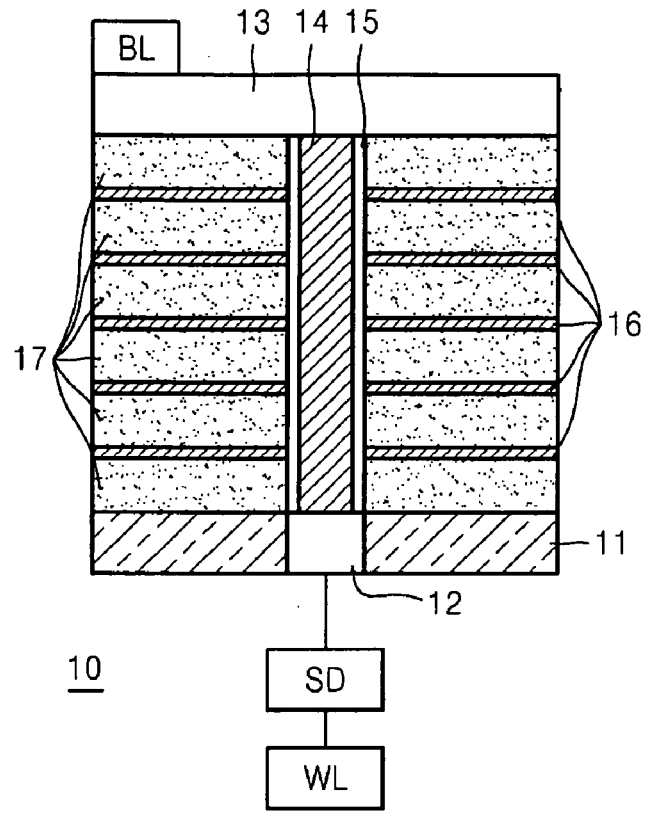
FIGS. 1-10 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of the structure of a memory cell 10 of a vertical string phase change random access memory device, according to an example embodiment. Referring to FIG. 1, the memory cell 10 may include a lower electrode 12, an upper electrode 13, a phase change material layer 14 between the lower electrode 12 and the upper electrode 13, an insulating film 15 that surrounds the phase change material layer 14, and a plurality of gate layers 16 which may be stacked proximally to the phase change material layer 14. The plurality of gate layers 16 may be stacked between either the lower electrode 12 or a first interlayer insulating layer 11 and the upper electrode 13, and may surround the insulating film 15. The memory cell 10 may include a switching device SD connected to the lower electrode 12. The lower electrode 12, the upper electrode 13, the phase change material layer 14, the insulating film 15, and the gate layers 16 may constitute a single storage node of the vertical string phase change random access memory device according to an example embodiment.

Referencing FIG. 1, the lower electrode 12 may be a plug-type electrode disposed in a contact hole of a first interlayer insulating layer 11. The lower electrode 12 may extend in a perpendicular direction to a surface of the drawing. The upper electrode 13, which may extend parallel to the surface of the drawing, may be disposed in an interlayer insulating film (not shown). The lower electrode 12 and the upper electrode 13 may electrically contact the phase change material layer 14. The lower electrode 12 may be electrically connected to a word line WL through the switching device SD, and the upper electrode 13 may be electrically connected to a bit line BL. The switching device SD may control signal access the storage node, and may be, for example, a diode or a transistor. Although relative placement of the elements in a memory cell is shown in FIG. 1, example embodiments are not limited thereto and one having ordinary skill in the art will recognize that different configurations are possible. For example, the switching device SD is shown between the lower electrode 12 and the word line WL; however, the switching device SD may be, for example, disposed between the upper electrode 13 and the bit line BL.

The phase change material layer 14 may have a bar shape that extends between the lower electrode 12 and the upper electrode 13. The insulating film 15 may completely surround the sides of the phase change material layer 14 to prevent or reduce the phase change material layer 14 from directly contacting the gate layers 16. The insulating film 15 may be, for example, a gate insulating film of a transistor. The gate layers 16, which may surround the phase change material layer 14 and the insulating film 15, may be parallel to each other and may have a thin film plane shape.

The gate layers 16 may correspond to different positions on the phase change material layer 14. Each of the gate layers 16 may apply an electric field to the phase change material layer 14 at a position corresponding to the position of each of the gate layers 16 relative to the phase change material layer 14. A plurality of second interlayer insulating layers 17 may be disposed between the lower electrode 12 and the upper electrode 13 so as to prevent or reduce the gate layers 16 from being electrically shorted to each other. For example, as depicted in FIG. 1, the second interlayer insulating layers 17 may alternate with the gate layers 16, between the first interlayer insulating layer 11 and/or the lower electrode 12, and the upper electrode 13. Interlayer insulating layers 17 may also be located between the gate layers 16 and the upper electrode 13 and/or the lower electrode 12, so as to prevent or reduce shorting of the gate layers 16 to either the upper electrode 13 or the lower electrode 12.

Figure 2:
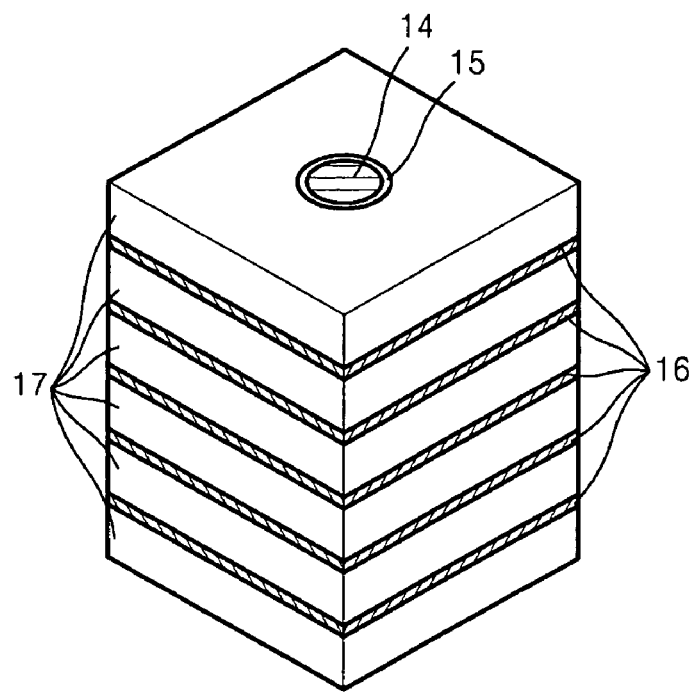

FIG. 2 is a perspective view of a portion of the memory cell 10 of FIG. 1 including the phase change material layer 14, the insulating film 15, the gate layers 16, and the second interlayer insulating layers 17, between the lower electrode 12 (not shown) and the upper electrode 13 (not shown). Referring to FIG. 2, the insulating film 15 and the phase change material layer 14 may be, for example, cylindrically shaped. The insulating film 15 and the phase change material layer 14 may extend perpendicularly through the second interlayer insulating layers 17 and the gate layers 16, which may be alternately stacked on the first interlayer insulating layer 11 (not shown). The memory cell structure may be formed, for example, by alternately forming the second interlayer insulating layers 17 and the gate layers 16, and etching a hole through the second interlayer insulating layers 17 and the gate layers 16. The insulating film 15 may fill the hole formed by the etching. A hole may be etched through the center of the insulating film 15 and the hole may be filled with the phase change material layer 14.

Figure 3:
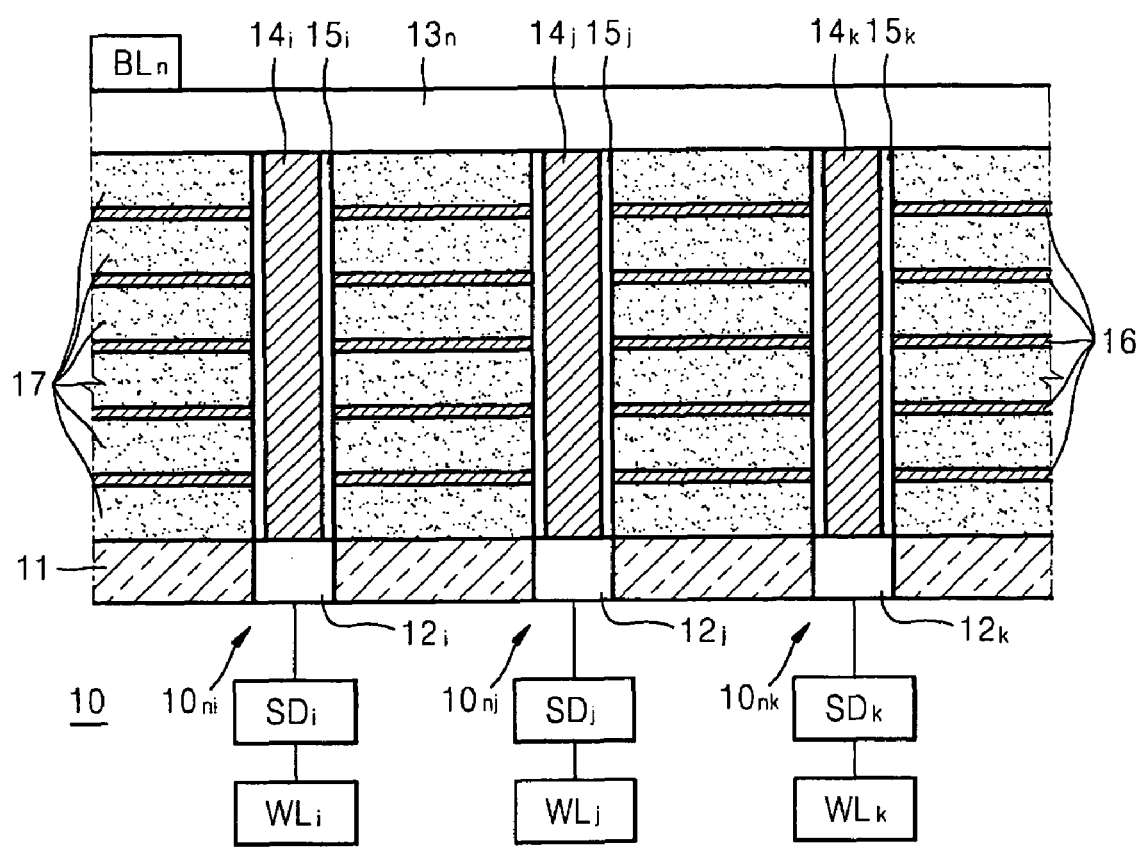

A plurality of memory cells 10 may be arranged as an array and constitute a single vertical string phase change random access memory device. FIG. 3 is a schematic cross-sectional view of a memory cell array of a vertical string phase change random access memory device, according to an example embodiment. Referring to FIG. 3, a plurality of electrodes 12$i$, 12$j$, and 12$k$ may extend perpendicularly to the surface of the drawing within the first interlayer insulating layer 11. The plurality of electrodes 12$i$, 12$j$, and 12$k$ may be connected to word lines WLi, WLj, and WLk through corresponding switching devices SDi, SDj, and SDk. A plurality of second interlayer insulating layers 17 and a plurality of gate layers 16 may be alternately stacked on the first interlayer insulating layer 11. A plurality of phase change material layers 14$i$, 14$j$, and 14$k$, and a plurality of insulating films 15$i$, 15$j$, and 15$k$, may extend through the second interlayer insulating layers 17 and the gate layers 16.

A third interlayer insulating layer (not shown) may be on a top surface of the uppermost second interlayer insulating layer 17. An upper electrode 13$n$ may extend parallel to the surface of the drawing in the third interlayer insulating layer (not shown). In FIG. 3, an n$^{th}$ bit line BLn may be connected to the upper electrode 13$n$. The plurality of memory cells 10$ni$, 10$nj$, and 10$nk$ in FIG. 3 may be between the n$^{th}$ bit line BLn and the word lines WLi, WLj, and WLk. The plurality of memory cells 10$ni$ through 10$nk$ may constitute an array of a single vertical string phase change random access memory device.

Operation of a vertical string phase change random access memory device according to an example embodiment will now be described. An example method of writing data in the memory cell 10 of the vertical string phase change random access memory device will now be described with reference to FIGS. 4-5. According to example embodiments, a SET state may be a crystalline phase that indicates a data signal of "0", for example, before a writing operation. A RESET state may be an amorphous phase that indicates a data signal of "1", for example, after the writing operation. One having skill in the related art will recognize that this is an example only and that the states are descriptive labels that may be interchanged without departing from the spirit or scope of example embodiments.

Figure 4:
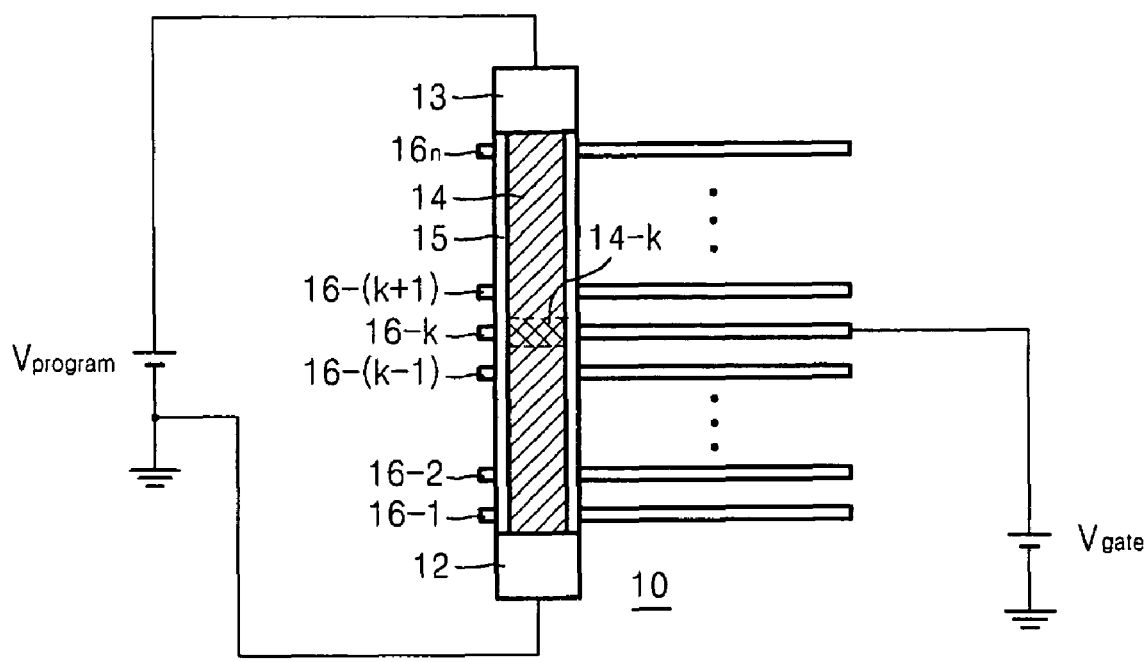

Referring to FIG. 4, where n number of gate layers 16-1 through 16-$n$ are present, data may be recorded in a region 14-$k$ of the phase change material layer 14 corresponding to a k$^{th}$ gate layer 16-$k$. In a writing operation, wherein the entire region of the phase change material layer 14 is in a crystalline phase, a positive gate voltage V$_{gate}$ may be applied to the k$^{th}$ gate layer 16-$k$. The gate voltage V$_{gate}$ may apply an electric field to the region 14-$k$ of the phase change material layer 14 by the k$^{th}$ gate layer 16-$k$, and as a result, the resistance of the region 14-$k$ is increased. A RESET pulse may applied to the phase change material layer 14 through the lower electrode 12 and the upper electrode 13. Most of the voltage drop may occur across the increased resistance of the region 14-$k$, thereby resetting the region 14-$k$. All of the regions of the phase change material layer 14, except for the region 14-$k$, may maintain a set state because the voltage drop in those regions may not generate enough current to cause phase transformation through Joule heating.

Figure 5:
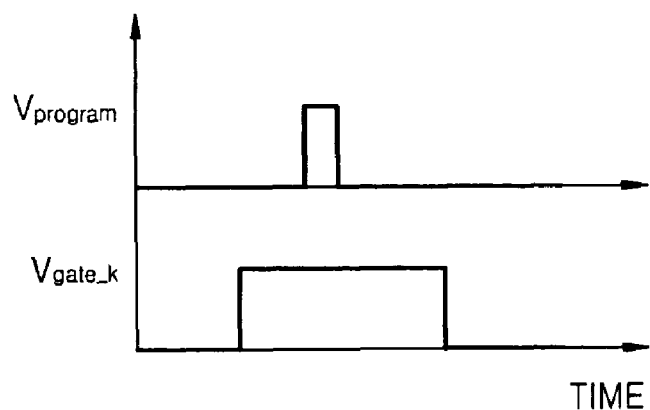

FIG. 5 shows an example sequence of a writing operation. Referencing FIG. 5, prior to applying a voltage V$_{program}$ to the phase change material layer 14, a gate voltage V$_{gate}$ is applied to the k$^{th}$ gate layer 16-$k$, and the gate voltage V$_{gate}$ is continuously applied until the region 14-$k$ of the phase change material layer 14 is reset. The voltage V$_{program}$ applied to the phase change material layer 14 has a reset pulse that melts and quenches the region 14-$k$. The crystalline phase of the region 14-$k$ is transformed into an amorphous phase, and the remainder of the regions of the phase change material layer 14 are maintained in the crystalline phase.

Figure 6:
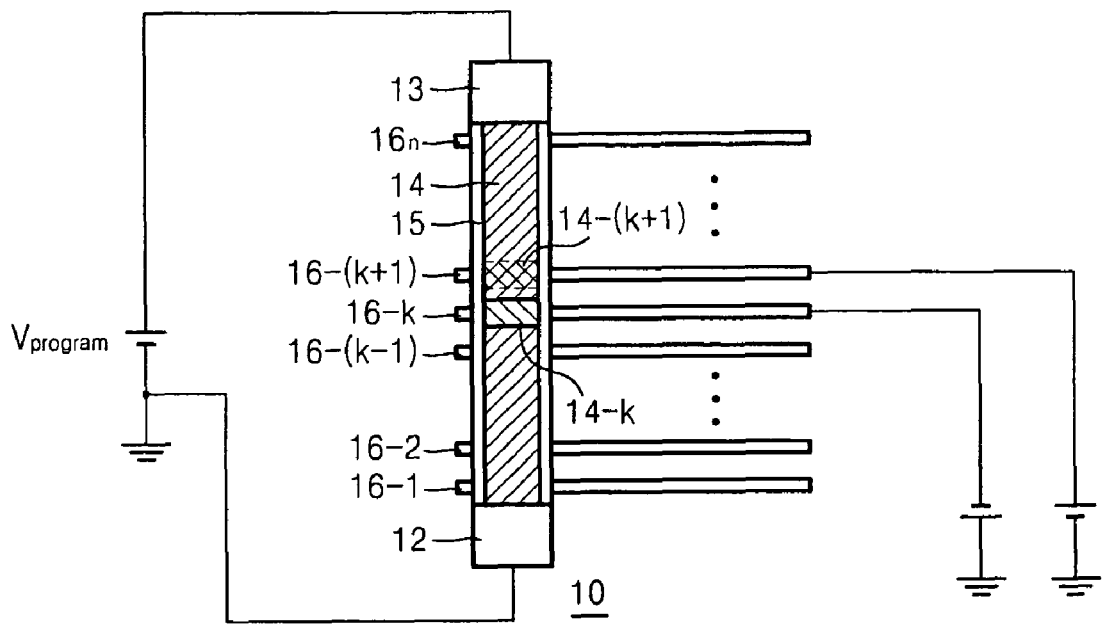
Figure 7:
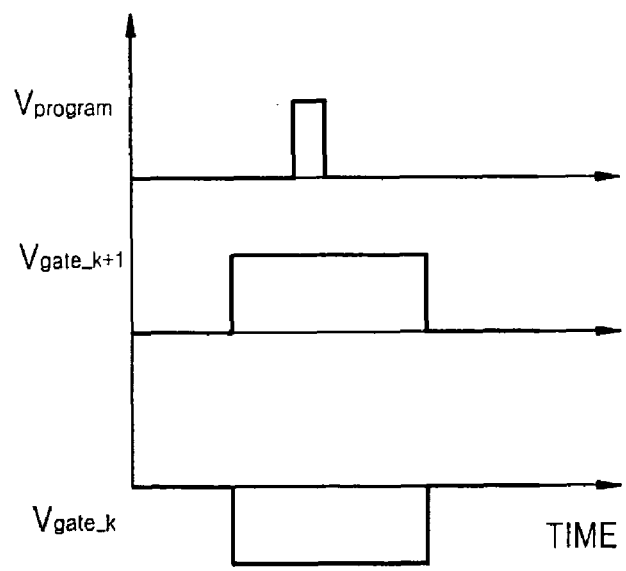

When data is already recorded in a specific region of the phase change material layer 14, a data writing operation may be performed in other regions of the phase change material layer 14. FIG. 6 is a schematic drawing for explaining a writing operation of a vertical string phase change random access memory device, according to an example embodiment. Referring to FIG. 6, data may be recorded in a region 14-($k$+1) when a writing operation has already been performed in the region 14-$k$ of the phase change material layer 14. Referring to FIG. 7, which shows an example sequence for applying a voltage when a writing operation is performed, a negative gate voltage V$_{gate\_k}$ is applied to the k$^{th}$ gate layer 16-$k$ and a positive gate voltage V$_{gate\_(k+1)}$ is applied to a k+1 gate layer 16-($k$+1). The gate voltage V$_{gate\_k}$ applies an electric field to the region 14-$k$ and the gate voltage V$_{gate\_(k+1)}$ applies an electric field to the region 14-($k$+1). When the positive gate voltage V$_{gate\_(k+1)}$ is applied to the crystalline phase region 14-($k$+1), the resistance of the crystalline phase region 14-($k$+1) is increased due to the applied electric field.

When the negative gate voltage V$_{gate\_k}$ is applied to the amorphous phase region 14-$k$, the resistance of the amorphous phase region 14-$k$ is reduced due the applied electric field. With V$_{gate\_k}$ and V$_{gate\_(k+1)}$ applied, a reset pulse V$_{program}$ is applied to the entire phase change material layer 14 through the lower electrode 12 and the upper electrode 13. Accordingly, a higher voltage drop occurs across the increased resistance region 14-($k$+1) than across the other regions of the phase change material layer 14, and the region 14-($k$+1) is reset. All of the regions of the phase change material layer 14, except for the region 14-($k$+1), maintain their original state because the voltage drop in those regions do not generate enough current to cause phase transformation through Joule heating. Therefore, the recording in the region 14-($k$+1) is performed without affecting the region 14-$k$ where data is already recorded.

Figure 8:
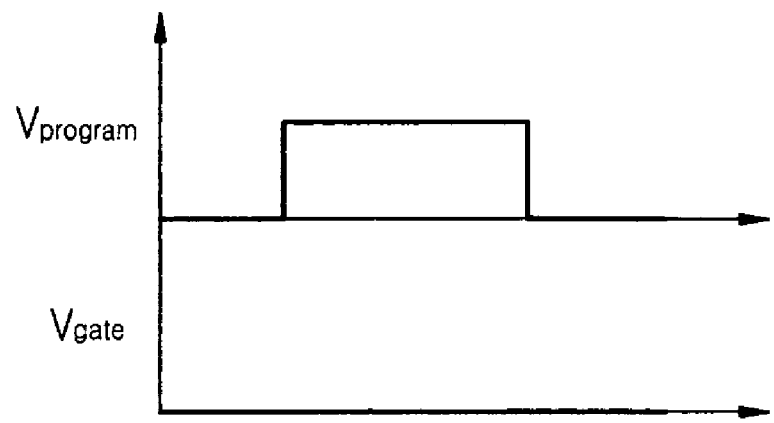

A method of erasing data in the memory cell 10 of the vertical string phase change random access memory device, according to example embodiments, will now be disclosed. Data erasing may be performed through a plurality of methods. For example, data may be erased through an annealing method or a slow-quenching method. In the annealing method, no voltage may be applied to the gate layers 16$a$ through 16$n$ and the temperature of the phase change material may be maintained at a temperature greater than the crystallization temperature of the phase change material, for a relatively long period of time, by applying a voltage only across the phase change material layer 14. FIG. 8 is a graph for explaining the annealing method. According to example embodiments, the entire phase change material layer 14 may be initialized into a crystalline phase. The annealing method may erase all data in the phase change material layer 14 and the overall data signal may be set to "0". The annealing method may be used, for example, in an initializing operation after manufacturing the vertical string phase change random access memory device, or a block erase, etc.

Figure 9:
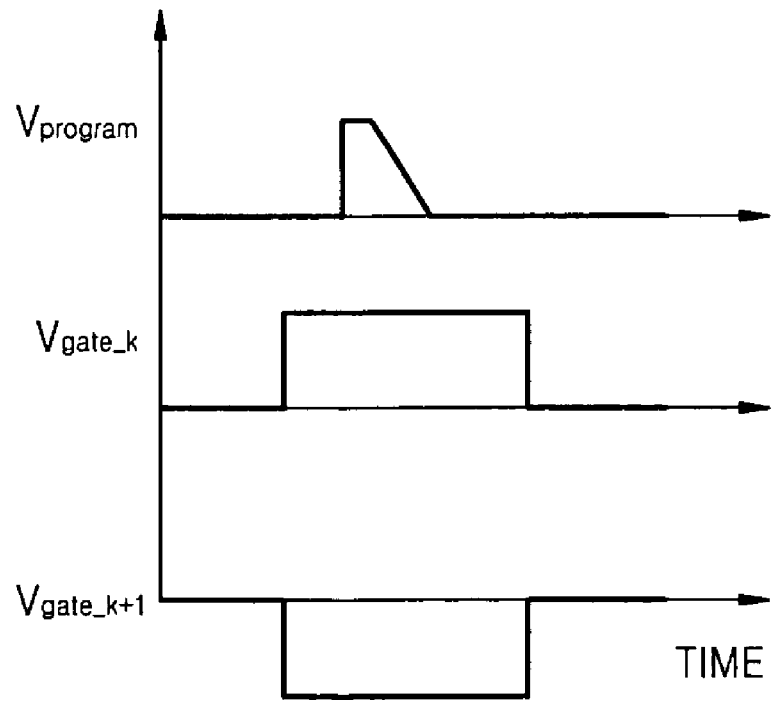

The slow-quenching method may be used to erase data in a specific region of a vertical string phase change random access memory device. For the purpose of explanation, referring to FIGS. 6, 7 and 9, the writing operation of FIG. 7 may be completed and data may be recorded in the two regions 14-k and 14-(k+1) of the phase change material layer 14. In order to erase only the data in the region 14-k, as shown in FIG. 9, a positive gate voltage $V_{gate\_k}$ may be applied to the $k^{th}$ gate layer 16-k and a negative gate voltage $V_{gate\_(k+1)}$ may be applied to the k+1 gate layer 16-(k+1). The gate voltage $V_{gate\_k}$ may apply an electric field to the region 14-k and the gate voltage $V_{gate\_(k+1)}$ may apply an electric field to the region 14-(k+1). The resistance of the region 14-(k+1) may be reduced due to the applied electric field and the resistance of the region 14-k may be maintained as high as the initial state. Alternatively, the positive gate voltage may be applied only to the region 14-k where data is erased and the negative gate voltage may be applied to all of the gate layers except 16-k.

A SET pulse may be applied across the entire phase change material layer 14 through the lower electrode 12 and the upper electrode 13. A voltage drop may occur in the region 14-k where there is increased resistance. The region 14-k may be melted and crystallize while slowly cooling. During the crystallization process, the resistance of the region 14-k may decrease and the voltage drop in the region 14-k may also decrease. However, the positive gate voltage applied to the $k^{th}$ gate layer 16-k may maintain a higher resistance state across the region 14-k due to the applied electric field. All of the regions of the phase change material layer 14, except for the region 14-k, may maintain their original resistance state. Therefore, data erasing in the region 14-k may be possible without affecting the remainder of the regions of the phase change material layer 14.

A method of reading data in a memory cell 10 of a vertical string phase change random access memory device according to an example embodiment will now be disclosed. In a first reading operation, a read gate voltage $V_{read}$ may be applied across the phase change material layer 14 without applying a gate voltage to any of the gate layers 16-1 through 16-n, in order to determine whether the phase change material layer 14 is in a higher or lower resistance state. A lower resistance state may indicate that the entire phase change material layer 14 is in a crystalline phase. A higher resistance state may indicate that any of the regions of the phase change material layer 14 are in an amorphous phase. There are many ways to determine whether the phase change material layer 14 is in a higher or lower resistance state. For example, the lower and higher resistance may be determined by comparing the resistance of the phase change material layer to a reference resistance. If the phase change material layer 14 is in a lower resistance state, the data for every region may be read as "0" because the entire phase change material layer 14 may be in the crystalline phase, which is an initial state.

Figure 10:
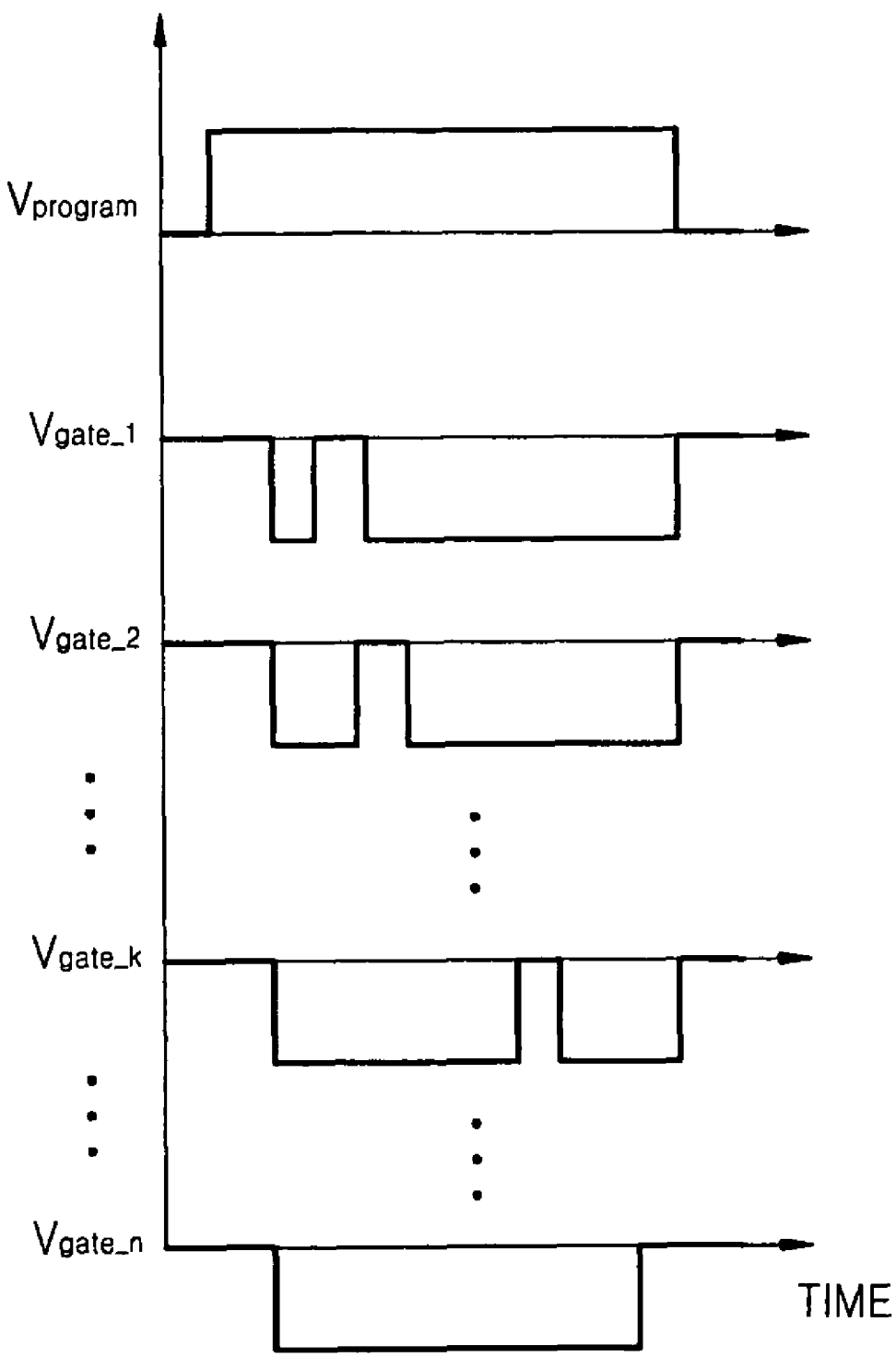

If the phase change material layer 14 is in a higher resistance state, a second step may be performed to detect which region(s) may be in an amorphous phase. FIG. 10 shows the application of voltages over time during the second step of a reading operation of a vertical string phase change random access memory device according to example embodiments. Referring to FIG. 10, a negative gate voltage may be applied to all of the gate layers 16-1 through 16-n and a read voltage may be applied across the phase change material layer 14. The resistance of the amorphous phase region(s) of the phase change material layer 14 on which data is recorded may be reduced due to the electric field generated by the applied voltage. Therefore, the resistance of the entire phase change material layer 14 may be reduced to a lower resistance state.

The gate voltages of the gate layers 16-1 through 16-n may be sequentially removed and then reapplied from the gate layer 16-1 to the gate layer 16-n. In this manner, a negative gate voltage may be applied to the all of the gate layers 16-1 through 16-n, except for the one gate layer that is currently being read. For example, after removing the gate voltage from the first gate layer 16-1, when the gate voltage is removed from the second gate layer 16-2, a negative gate voltage may be reapplied to the first gate layer 16-1, and therefore, a negative gate voltage may be applied to the gate layers 16-1 and 16-3 through 16-n, but not 16-2. During the second step, the resistance state of the phase change material layer 14 may be continuously checked. If the phase change material layer 14 enters a higher resistance state when the gate voltage is removed from one of the gate layers 16-1 through 16-n, a data "1" may be read from the region of the phase change material layer 14 that corresponds to that gate layer, because every other gate layer may be in a lower resistance state due to an applied gate voltage. For example, if the $k^{th}$ gate layer 16-k is in an amorphous phase and the negative gate voltage is removed from the $k^{th}$ gate layer 16-k, the effect of resistance reduction caused by the applied electric field disappears, transforming the phase change material layer 14 into a higher resistance state. In the second step, every region in the entire phase change material layer 14 may be read. Although example embodiments have been particularly described with respect to negative voltages being applied and removed, one having ordinary skill in the art will recognize that the memory may be read using voltages that are higher or lower relative to each other, so long as a current difference occurs in the device when a region in an amorphous state is being read relative to the current in the device when a crystalline region is being read.

Application Embodiments

Figure 11:
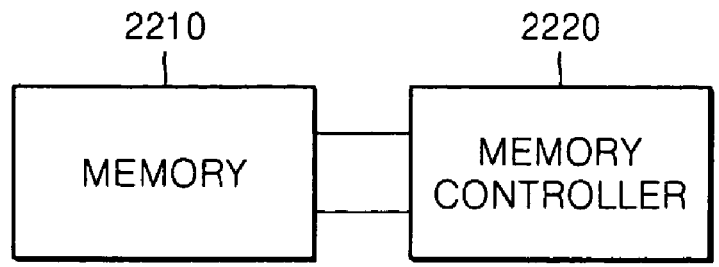
FIGS. 11-16 illustrate example embodiments of applications of the semiconductor device.

FIG. 11 illustrates an example embodiment of an application of the semiconductor device. As shown, this embodiment includes a memory 2210 connected to a memory controller 2220. The memory 2210 may be any of the semiconductor device embodiments described above. The memory controller 2220 supplies the input signals for controlling operation of the memory 2210. For example, the memory controller 2220 supplies the command CMD and address signals.

Figure 12:
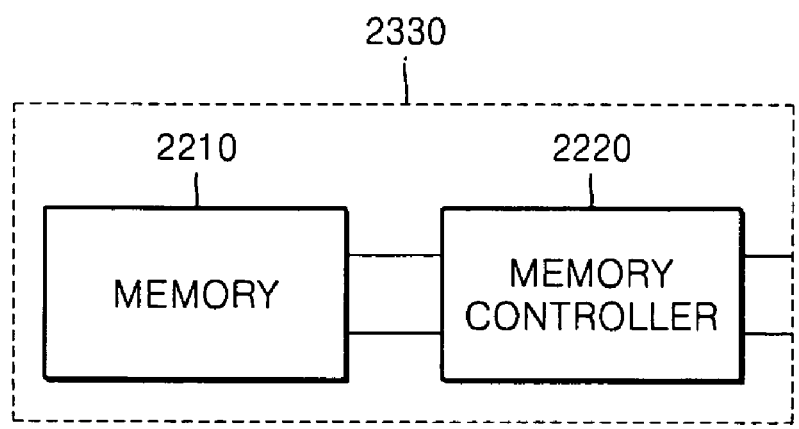

FIG. 12 illustrates yet another embodiment. This embodiment is the same as the embodiment of FIG. 11, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 13:
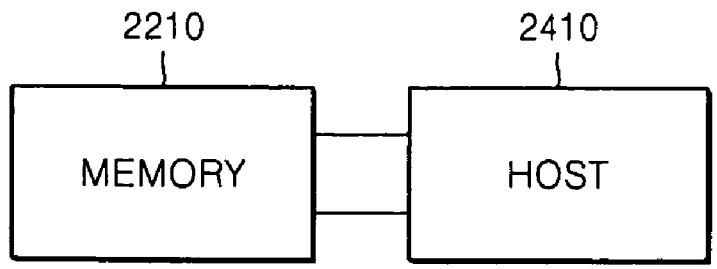

FIG. 13 illustrates a still further embodiment of the present invention. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command CMD and address signals.

Figure 14:
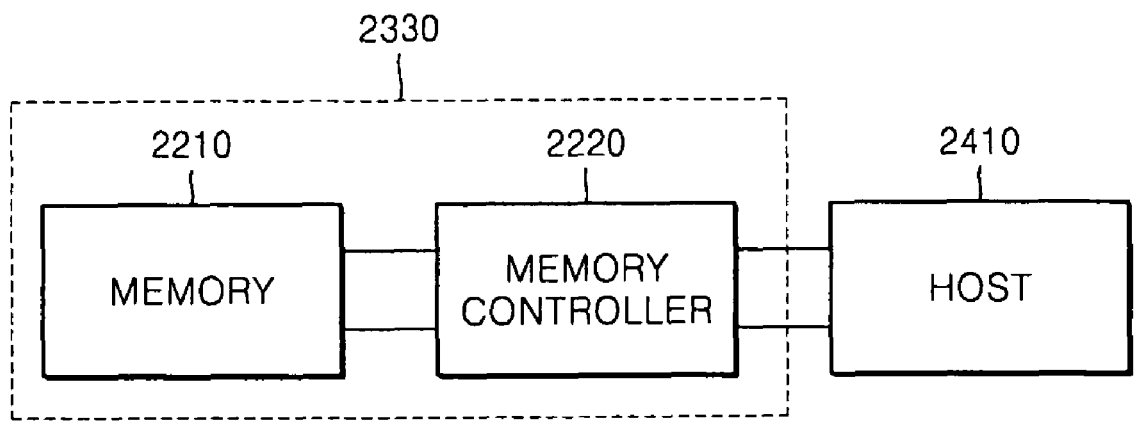

FIG. 14 illustrates an embodiment of the present invention in which the host system 2410 is connected to the card 2330 of FIG. 12. In this embodiment, the host system 2410 applies control signals to the card 2330 such that the memory controller 2220 controls operation of the memory 2210.

Figure 15:
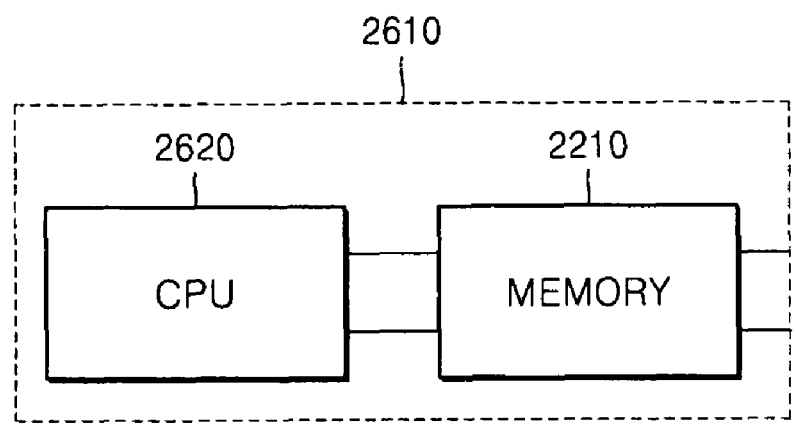

FIG. 15 illustrates a further embodiment of the present invention. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 15 does not illustrate the full complement of components that may be included within a computer system 2610 for the sake of clarity.

Figure 16:
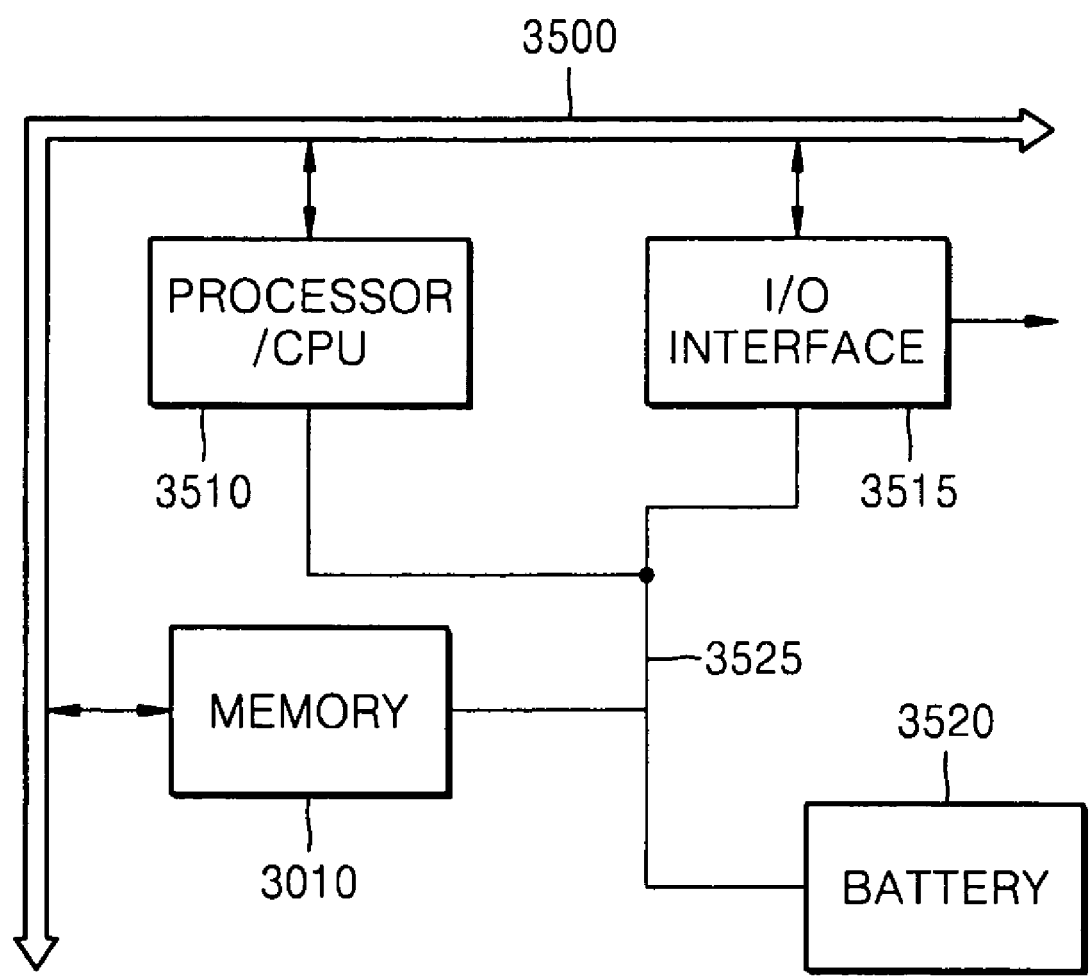

FIG. 16 illustrates another embodiment of the present invention. FIG. 16 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 16, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 16. Furthermore, the present invention is not limited to this architecture. For example, the memory 3010 may be replaced with the embodiment of FIG. 12, and communication with the processor 3510 may be via the memory controller 2220. Furthermore, the I/O interface 3515 may communicate with the memory 3010 via the memory controller 2220, or directly with the memory 3010 if the memory controller 2220 is not present. In portable applications, the above-described components are powered by a battery 3520 via a power supply bus 3525.

A vertical string phase change random access memory device according to example embodiments may improve integration density by including a memory cell with n gate layers 16 in which n bits of data may be recorded. The n bits of data may be recorded by controlling nothing more than the position of phase change in a single phase change material layer 14 and, as a result, may obtain increased reliability without a complicated configuration. Further, because the phase change occurs in a local region of the phase change material layer 14, the current required for SET or RESET may be reduced as compared to a conventional memory cell.

While example embodiments have been particularly shown and described, it will be understood by one of ordinary skill in the art that variations in form and detail may be made therein without departing from the spirit and scope of the claims.

What is claimed is:

1. A phase change random access memory device comprising:
    a lower electrode;
    an upper electrode;
    a phase change material layer between the lower electrode and the upper electrode;
    a plurality of gate layers formed along the phase change material layer;
    an insulating film between the phase change material layer and the plurality of gate layers; and
    a plurality of interlayer insulating layers between the plurality of gate layers, and between the lower and upper electrodes and the plurality of gate layers.

2. The phase change random access memory device of claim 1,
    wherein the phase change material layer has a cylindrical bar shape configured to extend between the lower electrode and the upper electrode, and electrically contact the lower electrode and the upper electrode,
    the insulating film surrounds the phase change material layer, and
    the plurality of gate layers surround the insulating film.

3. The phase change random access memory device of claim 1, wherein the plurality of gate layers have a thin film plane shape and are parallel to each other.

4. The phase change random access memory device of claim 3, wherein the plurality of gate layers correspond to different positions on the phase change material layer,
    the different positions on the phase change material layer define a plurality of regions in the phase change material layer, and
    each gate layer is configured to apply an electric field to the region corresponding to the gate layer.

5. The phase change random access memory device of claim 1, wherein the entire phase change material layer is in a crystalline phase at an initial state.

6. The phase change random access memory device of claim 5, further comprising:
    a plurality of regions corresponding to the plurality of gate layers,
    wherein the phase change material layer is configured to include one or more of the plurality of regions in an amorphous phase after one or more writing operations occur, the phase change random access memory is configured to perform the writing operation, and the writing operation includes applying a positive gate voltage to one of the plurality of gate layers and applying a RESET pulse to the phase change material layer through the upper electrode and the lower electrode.

7. The phase change random access memory device of claim 6, wherein the phase change random access memory device is configured so that during the writing operation, a negative gate voltage is applied to gate layers that correspond to regions of the phase change material layer in which data is already recorded and will remain recorded.

8. The phase change random access memory device of claim 2, wherein the phase change random access memory device is configured so that the entire phase change material layer is in a crystalline phase at an initial state after an initialization operation, and the initialization operation includes maintaining the temperature of the phase change material layer beyond a crystallization temperature by applying a voltage only to the phase change material layer without applying a voltage to the gate layers.

9. The phase change random access memory device of claim 6, wherein the phase change random access memory device is configured so that one or more of the plurality of regions is in a crystalline phase after one or more erase operations, and the erase operation includes applying a SET pulse to the phase change material layer through the upper electrode and the lower electrode when a positive gate voltage is applied to the gate layer that corresponds to the region of the phase change material layer from which data is to be erased and a negative gate voltage is applied to the remainder of the gate layers.

10. The phase change random access memory device of claim 6, wherein one or more of the plurality of regions is in an amorphous phase that is a high resistance state and/or in a crystalline phase that is a low resistance state, and the phase change random access memory device is configured so that high or low resistance states may be individually identified in a read operation, and the read operation includes determining whether all of the plurality of regions are in a low resistance crystalline state by applying a read voltage to the phase change material layer through the lower electrode and the upper electrode without applying a voltage to the gate layers, and if a high resistance state is determined additionally applying a negative voltage to all of the plurality of gate layers and sequentially removing and reapplying the gate voltage to the plurality of gate layers while the read voltage is continuously applied to the phase change material layer.

11. The phase change random access memory device of claim 1, wherein the entire phase change material layer is in an amorphous phase at an initial state.

12. The phase change random access memory device of claim 11, further comprising:
a plurality of regions corresponding to the plurality of gate layers, wherein the phase change random access memory device is configured so that one or more of the plurality of regions is in a crystalline phase after one or more writing operations occur, and a writing operation includes applying a positive gate voltage to one of the plurality of gate layers and applying a RESET pulse to the phase change material layer through the upper electrode and the lower electrode.

13. The phase change random access memory device of claim 12,
wherein one or more of the plurality of regions is in a crystalline phase that is a high resistance state and/or in an amorphous phase that is a low resistance state, and the phase change random access memory device is configured so that low or high resistance states may be individually identified in a read operation, and the read operation includes determining whether all of the plurality of regions are in a low resistance amorphous state by applying a read voltage to the phase change material layer through the lower electrode and the upper electrode without applying a voltage to the gate layers, and if a high resistance state is determined additionally applying a negative voltage to all of the plurality of gate layers and sequentially removing and reapplying the gate voltage to the plurality of gate layers while the read voltage is continuously applied to the phase change material layer.

14. A memory controller comprising the phase change random access memory of claim 1.

15. A card comprising the memory controller of claim 14.

16. A host system connected to the phase change random access memory of claim 1.

17. A mass storage device comprising the phase change random access memory of claim 1.

18. A phase change memory device comprising:
a first electrode;
a second electrode;
a first phase change material layer between the first electrode and the second electrode;
a first plurality of gate layers separated from each other along the phase change material layer;
a first insulating film between the phase change material layer and the plurality of gate layers;
a substrate, the first phase change material layer on the substrate,
an interlayer insulating layer on the first plurality of gate layers;
a third electrode on the interlayer insulating film;
a fourth electrode on the interlayer insulating film;
a second phase change material layer on the interlayer insulating film between the third and fourth electrodes;
a second insulating film on the second phase change material layer; and
a second plurality of gate layers on the second insulating film.

19. A phase change memory device comprising:
a substrate;
a first electrode on the substrate;
a first phase change material layer on the first electrode;
a second electrode on the first phase change material layer;
an first insulating film surrounding the first phase change material layer;
a first plurality of horizontal gate layers stacked vertically along the first insulating film and separated from each other;
a first plurality of insulating layers between the plurality of gate layers, and between the first and second electrodes and the plurality of gate layers,
an interlayer insulating film on the second electrode;
a third electrode on the interlayer insulating film;
a second phase change material layer on the third electrode;
a fourth electrode on the second phase change material layer;
an second insulating film surrounding the second phase change material layer;
a second plurality of horizontal gate layers stacked vertically along the second insulating film and separated from each other; and
a second plurality of insulating layers between the second plurality of gate layers, and between the third and fourth electrodes and the second plurality of gate layers.

* * * * *